(12) United States Patent
Simonin et al.

(10) Patent No.: US 10,062,823 B2
(45) Date of Patent: Aug. 28, 2018

(54) THERMOELECTRIC DEVICE, A THERMOELECTRIC MODULE COMPRISING SUCH A THERMOELECTRIC DEVICE AND A METHOD FOR PRODUCING SUCH A THERMOELECTRIC DEVICE

(71) Applicants: Valeo Systemes Thermiques, Le Mesnil Saint Denis (FR); Michel Simonin, Voisins-le-Bretonneux (FR)

(72) Inventors: Michel Simonin, Voisins-le-Bretonneux (FR); Cedric De Vaulx, Maurepas (FR)

(73) Assignee: VALEO SYSTEMES THERMIQUES, Le Mesnil Saint Denis (FR)

( * ) Notice: Subject to any disclaimer, the term of this patent is extended or adjusted under 35 U.S.C. 154(b) by 389 days.

(21) Appl. No.: 14/734,387

(22) Filed: Jun. 9, 2015

(65) Prior Publication Data

US 2015/0357547 A1 Dec. 10, 2015

(30) Foreign Application Priority Data

Jun. 10, 2014 (FR) ...................................... 14 55214

(51) Int. Cl.
*H01L 35/32* (2006.01)
*H01L 35/04* (2006.01)

(52) U.S. Cl.
CPC .............. *H01L 35/04* (2013.01); *H01L 35/32* (2013.01)

(58) Field of Classification Search
CPC .............................. H01L 35/325; H01L 35/34
See application file for complete search history.

(56) References Cited

U.S. PATENT DOCUMENTS

2005/0217714 A1 10/2005 Nishijima et al.
2009/0133734 A1* 5/2009 Takahashi ............... H01L 35/22
136/230

(Continued)

FOREIGN PATENT DOCUMENTS

EP 1 780 807 A1 5/2007
FR 2 732 819 A1 10/1996

(Continued)

OTHER PUBLICATIONS

JP07-335943, Machine Translation, Mochizuki, Dec. 1995 (Year: 1995).*

(Continued)

*Primary Examiner* — Devina Pillay
(74) *Attorney, Agent, or Firm* — Howard & Howard Attorneys PLLC

(57) ABSTRACT

The invention relates to a thermoelectric device comprising at least two thermoelectric elements (10, 20), called first (10) and second (20) elements, capable of generating an electric current under the effect of a temperature gradient applied between two of their faces, called first and second active faces, the first active faces being intended to exchange heat with a heat source of the temperature gradient, and the second active faces being intended to exchange heat with a cold source of the temperature gradient, said device comprising a first electrical connector (31) connecting the two elements (10, 20), said first connector (31) covering a first part (11, 21) of each first and, respectively, each second active face of said first (10) and second (20) elements, a second part (13, 23) of said first and, respectively, second active faces being left free. The invention further relates to a thermoelectric module comprising such a device and to a method for producing such a device.

9 Claims, 2 Drawing Sheets

(56) References Cited

U.S. PATENT DOCUMENTS

2013/0340803 A1    12/2013   Brueck et al.
2014/0216514 A1     8/2014   Simonin

FOREIGN PATENT DOCUMENTS

FR       2 976 124 A1    12/2012
JP       07-335943    * 12/1995  ............. H01L 35/32

OTHER PUBLICATIONS

French Preliminary Search Report for Application FR 1455214 dated Feb. 27, 2015, 2 pages.

English language abstract and machine-assisted English translation for FR 2 732 819 extracted from espacenet.com database on Jun. 29, 2015, 18 pages.

English language abstract not found for FR 2 976 124; however, see English language equivalent U.S. 2014/0216514. Original document extracted from espacenet.com on Jun. 29, 2015, 27 pages.

* cited by examiner

THERMOELECTRIC DEVICE, A THERMOELECTRIC MODULE COMPRISING SUCH A THERMOELECTRIC DEVICE AND A METHOD FOR PRODUCING SUCH A THERMOELECTRIC DEVICE

RELATED APPLICATIONS

This application claims priority to and all the advantages of French Patent Application No. FR 14/55214, filed on Jun. 10, 2014, the content of which are incorporated herein by reference.

The invention relates to a thermoelectric device, to a thermoelectric module comprising such a thermoelectric device and to a method for producing such a thermoelectric device.

BACKGROUND

In the automotive field, thermoelectric devices have already been proposed that use elements, called thermoelectric elements, allowing an electric current to be generated when a temperature gradient is present between two of their opposite faces, called active faces, according to the phenomenon known as the Seebeck effect. These devices comprise a first circuit, intended for the circulation of the exhaust gases of an engine, and a second circuit, intended for the circulation of a coolant of a cooling circuit. The thermoelectric elements are disposed between the first and the second circuit so as to undergo a temperature gradient originating from the difference in temperature between the hot exhaust gases and the cold cooling fluid.

The electric modules comprise electric tracks disposed on the active faces of the thermoelectric elements in order to transmit the electricity from an active face of a thermoelectric element to an active face of another thermoelectric element. The provision of these electric tracks on all of the active faces of the thermoelectric elements is known. This has the disadvantage of forming heat buffers between the thermoelectric elements and the hot and cold heat sources.

SUMMARY OF THE INVENTION

The object of the invention is to improve the situation, whilst avoiding short circuiting all or part of the thermoelectric elements.

Therefore, the invention relates to a thermoelectric device comprising at least two thermoelectric elements, called first and second thermoelectric elements, capable of generating an electric current under the effect of a temperature gradient applied between two of their faces, called first and second active faces, the first active faces being intended to exchange heat with a heat source of the temperature gradient and the second active faces being intended to exchange heat with a cold source of the temperature gradient.

According to the invention, said device comprises a first electrical connector electrically connecting the two thermoelectric elements, said first connector covering a first part of each first and, respectively, each second active face of said first and second thermoelectric elements, a second part of said first and, respectively, second active faces being left free.

The electrical connection between the thermoelectric elements of the device according to the invention is therefore made by a connector that only partly covers each first active face of said thermoelectric elements. This overcomes the disadvantage of the heat buffers between the thermoelectric elements and the heat sources, yet without creating a short circuit risk.

According to various embodiments of the invention, which can be taken separately or in combination:
the first thermoelectric element and the second thermoelectric element are configured so that a difference in electric potential generated by the first thermoelectric element is opposed, relative to the temperature gradient, to a difference in electric potential generated by the second thermoelectric element;
said first connector electrically connects the two thermoelectric elements in series;
said first electrical connector is located between an edge of the first thermoelectric element and a neighbouring edge of the second thermoelectric element so as to straddle said edges;
said edges of the first and second thermoelectric elements covered by said first electrical connector are shoulders;
said first and second active faces are connected together by at least one lateral face, called lateral connection face;
the device according to the invention comprises an electrically insulating element fully covering each lateral connection face of the first and second thermoelectric elements that are opposite each other, particularly in line with said first connector;
the second outer peripheral parts of said first and second thermoelectric elements, left free by said first electrical connector, support secondary heat exchange elements, called heat exchange fins, intended to exchange heat with the hot source of the temperature gradient;
the device according to the invention comprises a second electrical connector intended to connect one of the two thermoelectric elements of the device in series with a third thermoelectric element of said device;
said first connector is located at one of the active faces of the first and second thermoelectric elements and said second electrical connector is located between an edge of the other active face of the thermoelectric element, to which said third thermoelectric element is connected, and an edge of the corresponding active face of the third thermoelectric element so as to straddle said edges;
the thermoelectric elements of said device pairwise have a symmetrical shape relative to their connection face;
the thermoelectric elements are of annular shape;
said shoulder is annular;
said first electrical connector is mounted at an axial portion of an outer periphery of said thermoelectric elements;
said second electrical connector is mounted at an axial portion of an inner periphery of said thermoelectric elements;
the insulating elements are of annular shape;
the electrical connector is a ring, particularly located at said shoulder;
the device according to the invention comprises a second electrically insulating element covering all of the lateral connection faces of the thermoelectric element, to which said third thermoelectric element is connected, and said third thermoelectric element;
the thermoelectric elements, the electrical connectors and/or the insulating elements are coaxial.

Advantageously, a tube is inserted inside the thermoelectric elements. This tube is provided so that it is coaxial with the thermoelectric elements and the insulating elements.

Advantageously, this tube will be made of anodised aluminium.

The purpose of this tube is for the circulation of a coolant forming the cold source of said temperature gradient inside the thermoelectric module according to the invention.

The invention further relates to a thermoelectric module comprising a plurality of thermoelectric devices as described above.

The invention further relates to a method for producing a thermoelectric device as described above, wherein the first electrical connector is soldered onto each first active face of said first and second thermoelectric elements.

BRIEF DESCRIPTION OF THE DRAWINGS

The invention will be better understood and further objects, details, features and advantages of the invention will become apparent throughout the following detailed description of at least one embodiment of the invention, which is provided solely by way of illustration and non-limiting example, with reference to the accompanying schematic drawings, in which.

DETAILED DESCRIPTION

The invention relates to a thermoelectric device comprising at least two thermoelectric elements, reference signs 10, 20 in FIGS. 1 to 6. They are designated N and P in the figures in order to show the difference in their electrical behaviour subject to the same temperature gradient. Indeed, the first thermoelectric element 10, reference sign N, will be configured so that the difference in electric potential that it generates will be opposed, relative to the temperature gradient, to the difference in electric potential generated by the second thermoelectric element 20, reference sign P.

More specifically, these first and second thermoelectric elements 10, 20 are capable of generating an electric current under the effect of a temperature gradient applied between two of their faces, called first and second active faces. The first active faces are intended, in the example shown herein, to exchange heat with a heat source of the temperature gradient, and the second active faces are intended to exchange heat with a cold source of this temperature gradient.

Figure 1:
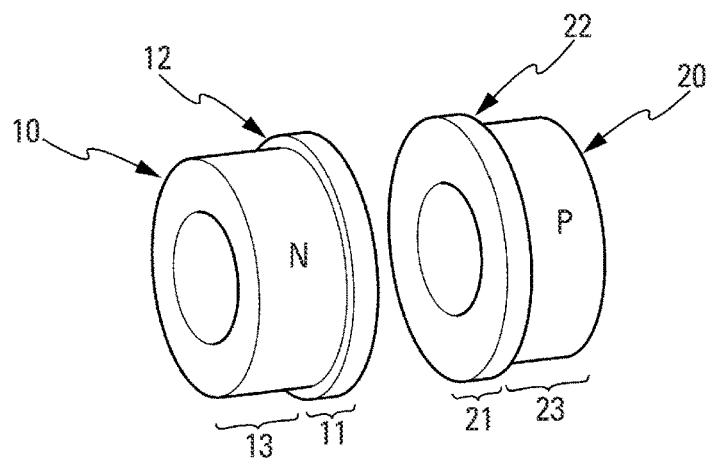
FIG. 1 is a schematic perspective and exploded view of a first and a second thermoelectric element of a thermoelectric device according to the invention.

In the embodiment shown herein, the thermoelectric elements 10, 20 are annular: they are in the form of hollow cylinders. In FIG. 1, the first active face, which is intended to exchange heat with the heat source, is the outer face of the cylinder. The second active face, which is intended to exchange with the cold source, is the inner face of said hollow cylinder.

Said first and second faces are, for example, of oval section for the first faces and/or of circular section for the second faces. More generally, any round and/or polygonal section is possible.

Such elements operate, according to the Seebeck effect, by allowing an electric current to be created in a charge connected between said faces that undergo the temperature gradient. In a manner known to a person skilled in the art, such elements are made up of bismuth telluride ($Bi_2Te_3$), for example.

In FIGS. 1 to 8, the thermoelectric elements 10, 20 shown are formed by a one-piece ring. Nevertheless, they can be formed by a plurality of parts each forming an angular portion of the ring.

The first surface has, for example, a radius that is between 1.5 and 4 times the radius of the second surface. It can have a radius equal to approximately two times that of the second surface.

Said thermoelectric elements have, for example, two opposite, parallel flat faces. In other words, the ring forming the thermoelectric element is of rectangular annular section.

Furthermore, each of said hollow cylinders has a shoulder 12, 22 on its outer face. Said shoulder 12, 22 herein extends in an annular manner over the periphery of each of said thermoelectric elements 10, 20.

The thermoelectric elements 10, 20 according to the invention also each have two cylindrical parts 11, 13, 21, 23, located here as a continuity in the axial extension of each other. These parts 11, 13, 21, 23 can be defined for each active face, whether this face is external, in contact with the heat source, or internal, in contact with the cold source.

Figure 2:
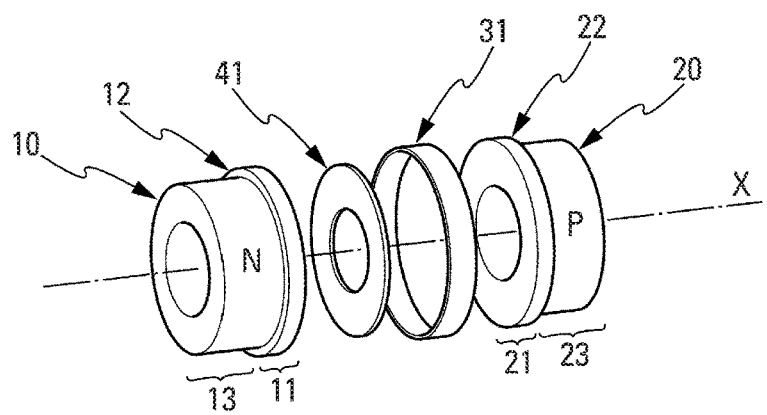
FIG. 2 is a view of the two elements of FIG. 1 with an electrical connector and an insulating element completing the device according to the invention.

As shown in FIG. 2, the device according to the invention comprises a first electrical connector 31 electrically connecting the two thermoelectric elements 10, 20. This first connector 31 covers the first part 11, 21 of each first active face of said first 10 and second 20 thermoelectric elements. Therefore, said first connector 31 electrically connects the two thermoelectric elements, particularly in series.

FIG. 2 also shows the fact that the active faces are connected together by at least one lateral face, called lateral connection face 41, which is electrically insulating in order to prevent any short circuit between said thermoelectric elements 10, 20. The thermoelectric elements are provided in a coaxial manner along the axis, reference sign X in the figures; said insulating elements are also provided in a coaxial manner along the same axis X.

Figure 3:
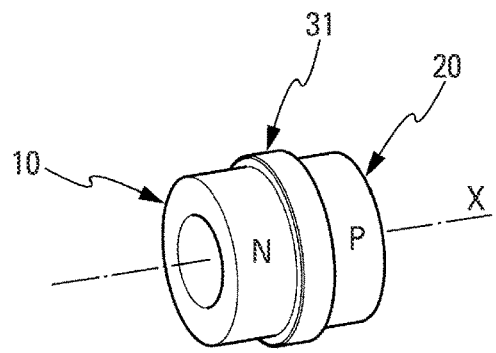
FIG. 3 shows the elements of FIG. 2 once assembled.

FIG. 3 shows said first electrical connector 31 located between the edge 12 of the first thermoelectric element 10 and the neighbouring edge 22 of the second thermoelectric element 20 so as to straddle said edges by covering the shoulders 12, 22 described above.

In particular, said connector 31 can be in the form of a ring. It is also designed to contribute to, or even to provide, the mechanical connection between said thermoelectric elements 10, 20, particularly by virtue of the assembly method described hereafter.

According to the invention, the second part 13, 23 of said first active faces is left free, the connector 31 only covering the first part 11, 21. This second part 13, 23 can in this way have greater contact with the heat source.

Figure 4:
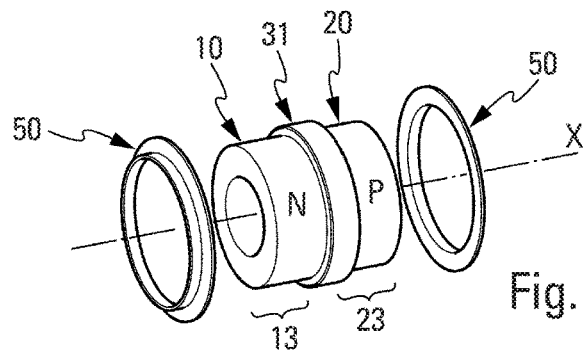
FIG. 4 shows the elements of FIG. 3 with an exploded view of the heat exchange fins completing the device according to the invention.

FIG. 4 shows the assembly of the fins 50 on said second outer peripheral parts 13, 23 of said first and second thermoelectric elements 10, 20. These fins 50 are secondary heat exchange elements intended to exchange heat with the heat source of the temperature gradient. The assembly that is obtained is shown in FIGS. 5 and 6.

Figure 5:
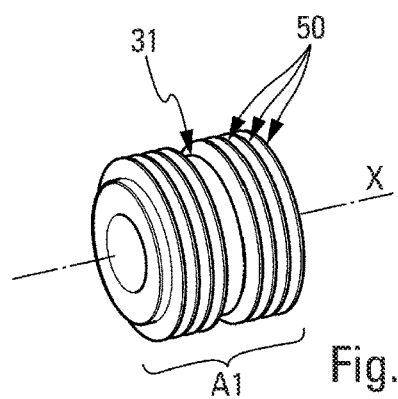
FIG. 5 shows an assembled version of the elements of FIG. 4.
Figure 6:
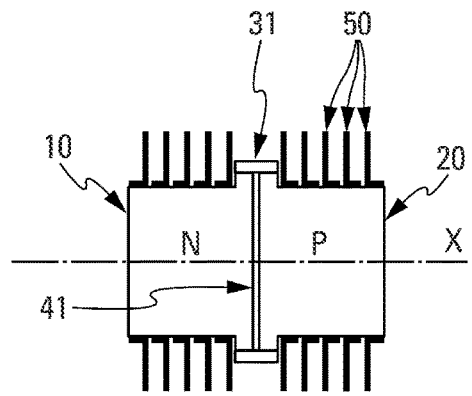
FIG. 6 is a longitudinal section view of FIG. 5.

FIG. 6 is a detailed view of this assembly. It is a section view of FIG. 5. In this figure, it can be seen that the insulating element 41 is sandwiched between said two elements 10, 20. The electrical (and mechanical) connector 31 is in turn positioned on the shoulders of the two elements 10, 20.

The connector occupies a limited surface area of the outer periphery of said two elements 10, 20. In this way a significant part of the active face intended to make contact with the heat source is left free, particularly for inserting said fins 50 therein, which further promotes the heat exchange with said heat source.

Figure 7:
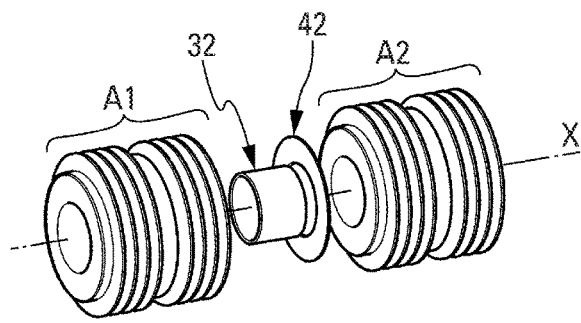
FIG. 7 shows two pairs of thermoelectric elements according to FIG. 5 intended to be connected by a second electrical connector.

FIG. 7 shows the assembly of FIG. 5, reference sign A1, with a second identical assembly, reference sign A2. These assemblies A1, A2 are electrically connected by virtue of a second electrical connector 32. This second connector 32 is intended to connect one of the two thermoelectric elements of the assembly A1 in series with a third thermoelectric element that belongs to the second assembly, reference sign A2.

As is the case for the first connector 31, said second electrical connector 32 is located in a straddling manner between an edge of the other active face of the thermoelectric element 20, to which said third thermoelectric element 10 is connected. In this case, the relevant active face is the internal face of said thermoelectric elements, which face is intended to make contact with the cold source. As is the case for the first connection described above, the device according to the invention comprises an insulating element 42. This second insulating element 42 covers all of the lateral connection faces.

The object is the same as before: to prevent any short circuit between the thermoelectric elements thus assembled.

Figure 8:
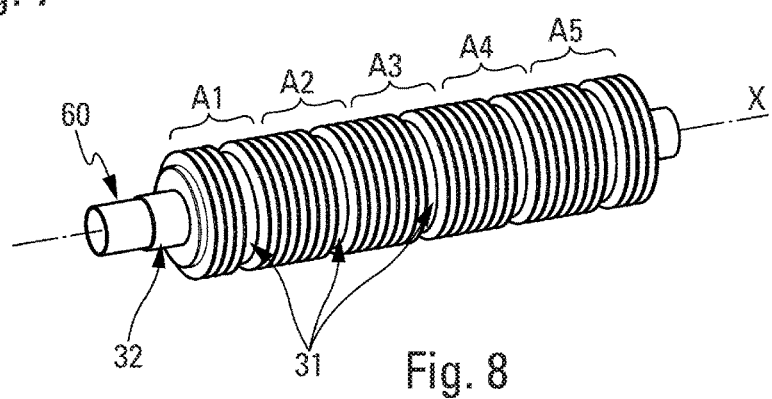
FIG. 8 shows a thermoelectric device according to the invention in the form of a rod of thermoelectric elements.

FIG. 8 shows an assembly of a plurality of assemblies A1-A6 such as that which has just been described with reference to FIG. 7. All of these assemblies A1-A6 in this case form a thermoelectric rod.

Advantageously, a tube 60 is inserted inside the thermoelectric elements 10, 20 of this thermoelectric rod. This tube 60 is provided coaxially with the thermoelectric elements 10, 20 and the insulating elements 41, 42. The purpose of this tube is to allow a coolant to circulate, as a cold source, inside the thermoelectric module according to the invention.

Advantageously, this tube will be made of anodised aluminium, particularly expanded aluminium.

The invention further relates to a thermoelectric module comprising a plurality of thermoelectric devices as described above in order to form a thermoelectric generator, for example.

In particular, said module can comprise a bundle of thermoelectric rods.

The invention further relates to a method for producing a thermoelectric device as described above, wherein the first electrical connector is soldered onto each first active face of said first and second thermoelectric elements 10, 20. It is this soldering operation that allows the electrical connectors 31, 32 to provide the mechanical link between the thermoelectric elements 10, 20, as previously stated.

It is to be noted by way of example that the fins 50 are advantageously press-fitted on the periphery of said first and second thermoelectric elements 10, 20.

Therefore, by virtue of the device according to the invention, the electrical connection between the thermoelectric elements 10, 20 of a thermoelectric rod is effected without introducing heat resistance between the heat source and said thermoelectric elements.

The amount of thermoelectric material that is available for heat exchange, in particular with the heat source, is therefore optimised and, consequently, so is the production of electrical power.

The invention claimed is:

1. A thermoelectric device comprising at least first and second thermoelectric elements each thermoelectric element having a first active face and a second active face, capable of generating an electric current under the effect of a temperature gradient applied between said first and second active faces wherein said first active faces are capable of exchanging heat with a heat source of the temperature gradient, and said second active faces are capable of exchanging heat with a cold source of the temperature gradient, said device further comprising a first electrical connector electrically connecting said at least two thermoelectric elements, said first electrical connector comprising an annulus and covering a first part of each first active face, or each second active face of said first and second thermoelectric elements, and wherein a second part of said first or said second active face is left free from covering by said first electrical connector,
   wherein said first electrical connector is located between a shoulder of said first thermoelectric element and a neighboring shoulder of said second thermoelectric element so as to straddle said shoulders,
   wherein said first thermoelectric element is an n-type thermoelectric element and said second thermoelectric element is a p-type thermoelectric element, and
   wherein said n-type thermoelectric element and said p-type thermoelectric element are disposed in an alternating arrangement extending along an axial direction.

2. The thermoelectric device according to claim 1, wherein said first and second active faces are connected together by at least one lateral connection face, said device further comprising an electrically insulating element fully covering each lateral connection face of said first and second thermoelectric elements that are opposite each other.

3. The thermoelectric device according to claim 1, wherein said second parts of said first and second active faces, which are located at the outer periphery of said first and second thermoelectric elements and which are left free from covering by said first electrical connector, support secondary heat exchange fins, capable of exchanging heat with the heat source of the temperature gradient.

4. The thermoelectric device according to claim 1, wherein each thermoelectric element is of annular shape.

5. The thermoelectric device according to claim 1, wherein said first electrical connector is a ring.

6. A thermoelectric module comprising a plurality of thermoelectric devices according to claim 1.

7. The thermoelectric device according to claim 1, further comprising a second electrical connector capable of connecting one of said at least two thermoelectric elements of said device in series with a third thermoelectric element of said device, wherein said third thermoelectric element has a first active face and a second active face.

8. The thermoelectric device according to claim 7, wherein said first electrical connector is located at one of the active faces of said first and second thermoelectric elements and said second electrical connector is located between an edge of the other active face of the thermoelectric element, to which said third thermoelectric element is connected, and an edge of the corresponding active face of said third thermoelectric element so as to straddle said edges.

9. A method for producing a thermoelectric device according to claim 1, wherein said first electrical connector is soldered onto both first active faces of said first and second thermoelectric elements.

\* \* \* \* \*